(12) United States Patent
Yang et al.

(10) Patent No.: US 10,971,215 B1
(45) Date of Patent: Apr. 6, 2021

(54) DYNAMICALLY ADJUST DATA TRANSFER SPEED FOR NON-VOLATILE MEMORY DIE INTERFACES

(71) Applicant: Western Digital Technologies, Inc., San Jose, CA (US)

(72) Inventors: Nian Yang, Mountain View, CA (US); Sahil Sharma, San Jose, CA (US); Piyush Dhotre, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/798,590

(22) Filed: Feb. 24, 2020

(51) Int. Cl.
| | |
|---|---|
| *G11C 11/56* | (2006.01) |
| *G11C 11/4096* | (2006.01) |
| *G11C 11/4076* | (2006.01) |
| *G11C 29/42* | (2006.01) |
| *G11C 29/44* | (2006.01) |
| *G11C 29/46* | (2006.01) |
| *G11C 7/22* | (2006.01) |

(52) U.S. Cl.
CPC .......... *G11C 11/4096* (2013.01); *G11C 7/222* (2013.01); *G11C 11/4076* (2013.01); *G11C 11/5628* (2013.01); *G11C 11/5642* (2013.01); *G11C 29/42* (2013.01); *G11C 29/44* (2013.01); *G11C 29/46* (2013.01); *G11C 2211/5641* (2013.01)

(58) Field of Classification Search
CPC ................................................. G11C 11/5628
USPC .................................................... 365/185.03
See application file for complete search history.

(56) References Cited

U.S. PATENT DOCUMENTS

| | | |
|---|---|---|
| 8,090,902 B1 | 1/2012 | Bennett et al. |
| 8,954,948 B2 | 2/2015 | Berner et al. |
| 9,116,620 B2 | 8/2015 | Lassa et al. |
| 9,336,842 B2 | 5/2016 | Moon et al. |
| 9,495,101 B2 | 11/2016 | Lieber |
| 9,524,799 B2 | 12/2016 | Desireddi et al. |
| 9,626,106 B2 | 4/2017 | Hsu et al. |
| 9,652,156 B2 | 5/2017 | Alcantara et al. |
| 9,652,379 B1 | 5/2017 | Syu et al. |
| 9,715,939 B2 | 7/2017 | Ellis et al. |
| 9,818,458 B1 | 11/2017 | Jayachandran et al. |
| 9,857,978 B1 | 1/2018 | Griffin |
| 9,910,597 B2 | 3/2018 | Yao et al. |
| 9,916,104 B2 | 3/2018 | Jayachandran et al. |
| 9,996,486 B2 | 6/2018 | Zehavi et al. |

(Continued)

*Primary Examiner* — Jason Lappas
(74) *Attorney, Agent, or Firm* — Patterson & Sheridan, LLP; Steven H. Versteeg

(57) ABSTRACT

A circuit configured to dynamically adjust data transfer speeds for a non-volatile memory die interface. The circuit includes an initialization circuit, a control circuit, a switch circuit, and a read-write circuit. The initialization circuit is configured to load multi-level cell settings that configure a memory interface for transfer of data for storage cells configured to store more than one bit per storage cell. The control circuit is configured to receive a read command that references single-level storage cells of a memory die. The switch circuit is configured to switch settings for the memory interface from the multi-level cell settings to single level cell settings, in response to receiving the read command. The read-write circuit is configured to read data for the read command from the memory die using the single level cell settings.

20 Claims, 8 Drawing Sheets

(56) References Cited

U.S. PATENT DOCUMENTS

| | | |
|---|---|---|
| 10,014,056 B1 | 7/2018 | Lee et al. |
| 2007/0005626 A1 | 1/2007 | Yang et al. |
| 2016/0189758 A1* | 6/2016 | Desireddi ............ G11C 29/023 365/193 |

* cited by examiner

DYNAMICALLY ADJUST DATA TRANSFER SPEED FOR NON-VOLATILE MEMORY DIE INTERFACES

BACKGROUND

Non-volatile memory systems, such as flash memory, have been widely adopted for use in business and consumer products. Flash memory may be found in different forms, for example in the form of a portable memory card that can be carried between host devices or as a solid-state disk (SSD) embedded in a host device. The industry continuously presses for larger storage capacity and faster memory access speeds for SSD devices, such as NAND flash.

To increase storage capacity, many NAND flash devices implement a storage cell structure capable of storing multiple bits of data per storage cell (i.e., multi-level storage cell or "MLC"), rather than single binary bit of data (i.e., single-level storage cell or "SLC"). "Storage cell" refers to a type of storage media configured to represent one or more binary values by way of a determinable characteristic of the storage media when the storage media is sensed, read, or detected to determine the binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Threshold" refers to a level, point, magnitude, intensity, or value above which a condition is true or will take place and below which the condition is not true or will not take place. (Search "threshold" on Merriam-Webster.com. Merriam-Webster, 2019. Web. 14 Nov. 2019. Edited)

Various storage cell capacities may incur a variety of access speed considerations. As NAND flash SLC programming speed improves, the relative overhead of the program performance may be affected by the data transfer speed between the NAND flash and the system controller. A single program operation to a set of storage cells in NAND flash memory may typically be significantly longer than a read operation for the same set of storage cells. This generally higher program latency may be balanced across typical storage operations by the fact that read operations may be much more common than program operations. Put another way, writing data may take much longer than reading the same data, but certain data may need to be written once, and subsequently read multiple times.

"Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

Program performance overhead may refer to a percentage of time a read operation takes relative to a program operation. For example, at a toggle mode (TM) NAND flash interface having a data transfer speed/rate of 533 MB/s, reading 32 KB data from SLC memory may take about 58 us, while the SLC program time for 32 KB may be about 100 us, thus creating an overhead of ~58%.

MLC memory programming time may generally take much longer than SLC memory programming due to the afore mentioned understanding that data writes may take a relatively long time, coupled with the fact that two, three, four, or more times the data may be written to the same number of storage cells. However, read times may differ little between SLC and MLC memory structures. Thus, transfer time overhead for MLC memory may be much lower than for SLC memory, because the transfer or read time for a specific amount of data may represent an even smaller percentage of the program or write time.

For example, at TM=533 MB/s, TLC programming for 96 KB of data may be about 1,600 us, but the TLC transfer may occur at a similar rate to SLC, such as about 174 us for 96 KB of data. The overhead for TLC in this example is then about 11%, and the difference may be even larger for QLC, which may have a typical overhead of 2.3%. In order to improve performance in NAND flash systems employing SLC memory structures, there is, therefore, a need to reduce SLC storage operation overhead.

BRIEF SUMMARY

This disclosure relates to a circuit configured to dynamically adjust data transfer speed for a non-volatile memory die interface. The circuit comprises an initialization circuit, a control circuit, a switch circuit, and a read-write circuit. The initialization circuit is configured to load multi-level cell settings to configure a memory interface for transfer of data for storage cells configured to store more than one bit per storage cell (single-level storage cell). The control circuit is configured to receive a first read command that references a set of single-level storage cells of a memory die. The switch circuit is configured to switch settings for the memory interface from the multi-level cell settings to single level cell settings, in response to receiving the first read command. The read-write circuit is configured to read data for the first read command from the memory die using the single level cell settings.

This disclosure further relates to a method for dynamically adjusting data transfer speed for a non-volatile memory die interface. A first read command is received, referencing a single-level storage cell of a memory die. A data transfer speed of a memory interface of the memory die is then set to a first data transfer speed that leverages the memory interface for data transfer from the single-level storage cell. Finally, data is transferred from the single-level storage cell over the memory interface using the first data transfer speed.

This disclosure relates to a system configured to dynamically adjust data transfer speed for a non-volatile memory die interface. The system comprises a storage controller and a die controller of a memory die. The storage controller includes a driver, a clocking circuit, and a signal integrity circuit. The driver is coupled to a data bus and a strobe line of a memory interface.

The driver is operable to adjust the data transfer speed of the data bus and the strobe line. The driver is characterized by a plurality of data transfer speeds, each of which present a different signal integrity.

A clocking circuit reduces the data transfer speed by delaying transmission of a strobe signal communicated by the strobe line. The clocking circuit is characterized by a set of interface clock speeds.

A signal integrity circuit is configured to determine a signal integrity for the memory interface for a particular data transfer speed. The die controller of the memory die is coupled to the storage controller via the data bus and the strobe line.

A storage controller is configured to write test data to a set of multi-level storage cells in the memory die via the data bus at a data transfer speed. The storage controller is also configured to read the test data via the data bus from the multi-level storage cells at the data transfer speed.

The storage controller then instructs the driver to change the data transfer speed to one of the plurality of data transfer speeds and, at each data transfer speed, write and read test data from the multi-level storage cells at the each of the data transfer speeds. For each of the plurality of data transfer speeds, the storage controller determines a signal integrity for writing and reading the test data. Then, the storage controller determines a multi-level storage cell data transfer speed for storage operations involving the multi-level storage cells such that the signal integrity satisfies a multi-level error correction threshold.

A storage controller is also configured to write test data to a set of single-level storage cells in the memory die via the data bus at a data transfer speed. The storage controller is also configured to read the test data via the data bus from the single-level storage cells at the data transfer speed.

The storage controller then instructs the driver to change the data transfer speed to one of the plurality of data transfer speeds and, at each data transfer speed, write and read test data from the single-level storage cells at the each of the data transfer speeds. For each of the plurality of data transfer speeds, the storage controller determines a signal integrity for writing and reading the test data. Then, the storage controller determines a single-level storage cell data transfer speed for storage operations involving the single-level storage cells such that the signal integrity satisfies a single-level error correction threshold.

The storage controller further comprises a read-write circuit. The read-write circuit is configured to service storage operations for the single-level storage cells using the single-level storage cell data transfer speed and to service storage operations for the multi-level storage cells using the multi-level storage cell data transfer speed.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The NAND data toggle mode (TM) speed for a NAND flash system may be determined by multiple factors, including system temperature, routing, input/output duty cycle imbalance, and signal integrity of the transfer. This signal integrity is limited by an "eye-open" window for input/output signals, and this window can be tuned specifically. With advances in SLC technology, SLC memory usually has better read margins, and thus higher tolerance for the data bit error rate (BER) when compared to MLC/TLC/QLC technology. Disclosed herein are a circuit, method, and system that take advantage of the fact that a faster TM setting that is tuned for SLC data transfer may be used to reduce SLC storage operation overhead, while a normal TM setting that is set for MLC/TLC/QLC may operate at slower speed for improved signal integrity where storage operation overheads are smaller.

"Bit error rate" refers to a measure of a number of bits in error of a total overall number of bits processed. In certain embodiments, a bit error rate is calculated after an Error Correction Code (ECC) decoder has made one or more attempts to correct one or more bits in error.

Figure 1:
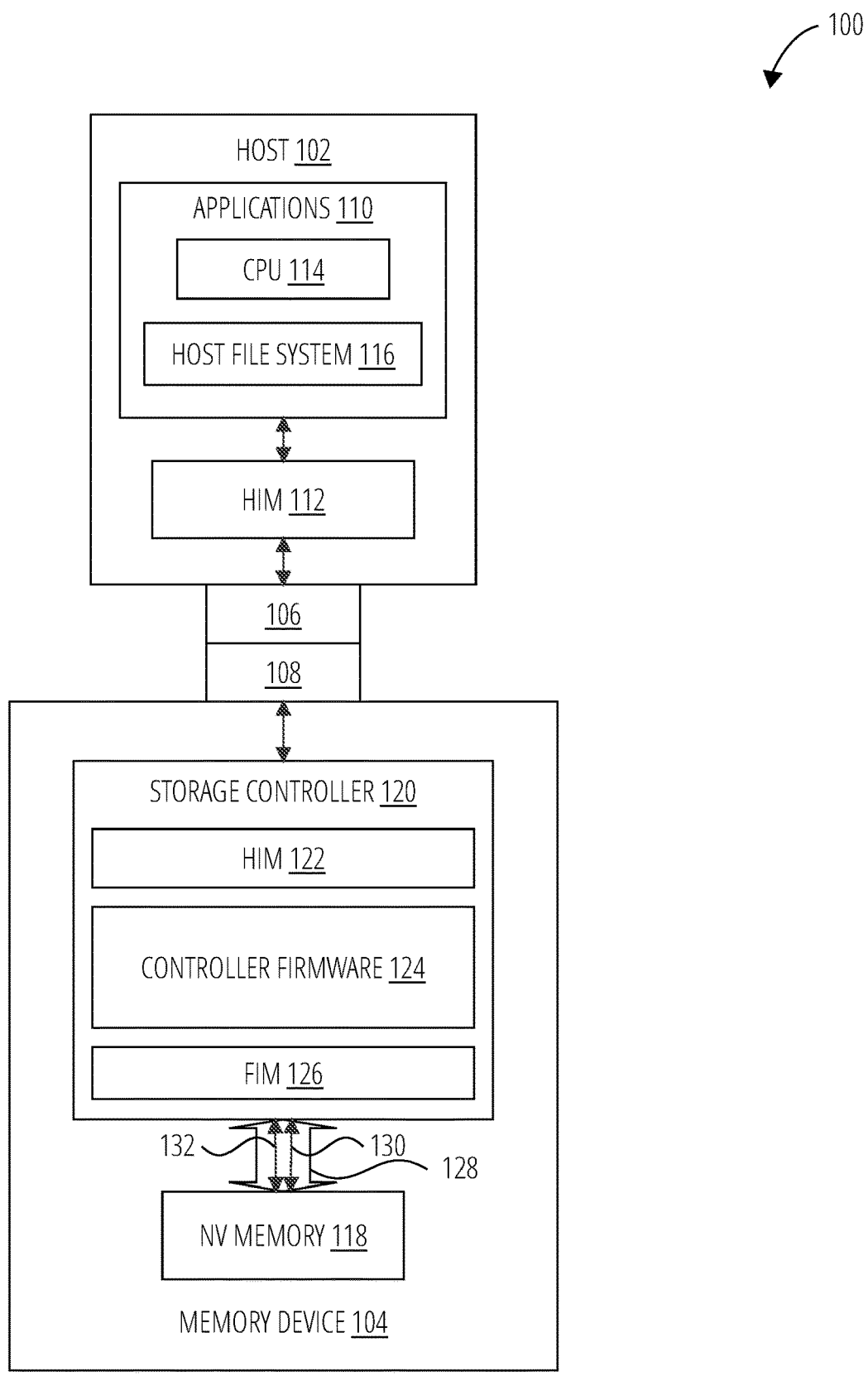
FIG. 1 is an exemplary block diagram of a memory system 100 that may implement the system and methods described herein.

A memory system 100 suitable for implementing circuits, methods, apparatus, and systems that change a memory die interface based on a type of storage cell being accessed is depicted in FIG. 1. A host 102 of FIG. 1 stores data into and retrieves data from a memory device 104.

The host 102 may be any computing device or computer device or computer system configured to send and receive storage commands. Examples of a host 102 include, but are not limited to, a computer, a laptop, a mobile device, an appliance, a virtual machine, an enterprise server, a desktop, a tablet, a main frame, and the like. In operation, when the host 102 device needs to read data from, or write data to, the memory device 104, host 102 may communicate with the storage controller 120.

The memory device 104 may be embedded within the host 102, such as in the form of a solid-state disk (SSD) drive installed in an enterprise server or a personal computer. In one embodiment, the memory device 104 may be removably connected to the host 102 through connector 106 and connector 108 of a mechanical and electrical connector as illustrated in FIG. 1. The connector 106 and connector 108 may allow the storage controller 120 to communicate with the host 102 through a host interface manager 122 (HIM) on the memory side of the connectors and a host interface manager 112 on the host side of the connectors. A memory device 104 configured for use as an internal or embedded SSD drive may be in the form of discrete modules that are drop-in replacements for rotating magnetic disk drives. As described, flash memory may refer to the use of a negated AND (NAND) storage cell that stores an electronic charge.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may include adapters into which a memory card is plugged. The memory system may include its own storage controller and drivers but there may also be some memory-only systems that are instead controlled by software executed by the host to which the memory is connected.

In some memory systems containing the storage controller, especially those embedded within a host, the memory storage controller and drivers are may be formed on a single integrated circuit chip. The host may communicate with the memory card using any communication protocol such as but not limited to Secure Digital (SD) protocol, Memory Stick (MS) protocol and Universal Serial Bus (USB) protocol.

The host 102 of FIG. 1 may be viewed as having two major parts, insofar as the memory device 104 is concerned, made up of a combination of circuitry and software. An applications 110 portion may interface with the memory device 104 through a host file system 116 and host interface manager 112. The storage controller 120 may include a corresponding host interface manager 122 in one embodiment. In a PC, for example, the applications 110 portion may include a central processing unit (Central processing unit (CPU) 114) for running word processing, graphics, control or other popular application software. In a camera, cellular telephone that is primarily dedicated to performing a single set of functions, the applications 110 portion may be implemented in hardware for running the software that operates the camera to take and store pictures, the cellular telephone to make and receive calls, and the like.

The memory device 104 of FIG. 1 may include non-volatile memory 118 and a storage controller 120 that both interfaces with the host 102 to which the memory device 104 is connected for passing data back and forth and controls the non-volatile memory 118. The storage controller 120 may interface with the host 102 device and transmit command sequences for read, program, and erase operations to the non-volatile memory 118. The commands may include logical and/or physical addresses.

"Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

The storage controller 120 can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The storage controller 120 may include a multi-thread processor capable of communicating via a flash interface manager (FIM), flash interface manager 126, having I/O ports for each memory bank in the non-volatile memory 118. In an exemplary embodiment, storage controller 120 may be implemented as an application specific integrated circuit (ASIC).

The storage controller 120 can be configured with hardware and/or firmware to perform the various functions described below and shown in the flow diagrams. Also, some of the components shown as being internal to the controller can also be positioned external to the controller, and other components can be used. Additionally, the phrase "operatively in communication with" could mean directly in communication with or indirectly (wired or wireless) in communication with through one or more components, which may or may not be shown or described herein.

Storage controller 120 may communicate with a controller (not shown) of non-volatile memory 118 via a memory interface 128. The memory interface 128 may include a data bus 130 and a control bus 132. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, and the like.

"Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search die (integrated circuit) on Wikipedia.com Oct. 9, 2019. Accessed Nov. 18, 2019.) A memory die is a die, in one embodiment, that includes a functional circuit for operating as a non-volatile memory media and/or a non-volatile memory array.

"Data bus" refers to a communication bus used to exchange one or more of data bits between two electronic circuits, components, chips, die, and/or systems. A data bus may include one or more signal lines. A sender, such as a controller, may send data signals over one or more control lines of the data bus in parallel or in series. Examples data buses may include 8-bit buses having 8 control lines (also called data lines, if they only carry data signals), 16-bit buses having 16 control lines, 32-bit buses having 32 control lines, 64-bit buses having 64 control lines, and the like.

In one embodiment, a single data bus may be shared by a plurality of components, such as memory die. When multiple chips or memory die share a data bus, that data may be accessed or transferred by a single memory die or by all the memory die in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal.

"Control bus" refers to a communication bus used to exchange one or more of data, address information, control signals, clock signals, and the like, between two electronic circuits, components, chips, die, and/or systems. Typically, a control bus sends control signals to one or more memory die to manage operations on the memory die.

In certain embodiments, the control bus sends control signals such as write enable ("WE" or "WE #"), chip enable ("CE" or "CE #"), read enable ("RE" or "Re"), a clock signal, strobe signal ("DQS"), command latch enable ("CLE"), address latch enable ("ALE"), storage operation commands in the form of operation codes ("OP" codes) and addressing information for a communicated storage operation. In certain embodiments, the control bus may not transfer data relating to a storage operation, such as write data or read data. Instead, write data and read data may be transferred over a data bus.

The memory interface 128 between the storage controller 120 and the non-volatile memory 118 may be any suitable flash interface, such as Toggle Mode. In one embodiment, the memory system 100 may be a card-based system, such as a secure digital (SD™) or a micro secure digital (micro-SD™) card. In an alternate embodiment, the memory system 100 may be part of an embedded memory device.

The non-volatile memory 118 may be any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like.

The alterable physical characteristic is such that, once set, the physical characteristic stays sufficiently fixed such that when a primary power source for the non-volatile memory 118 is unavailable the alterable physical characteristic can be measured, detected, or sensed, when the binary value is read, retrieved, or sensed. Said another way, non-volatile memory 118 is a storage media configured such that data stored on the non-volatile memory 118 is retrievable after a power source for the non-volatile memory 118 is removed and then restored. Non-volatile memory 118 may comprise one or more non-volatile memory elements, which may include, but are not limited to: chips, packages, planes, dies, and the like.

"Storage media" refers to any physical media organized and configured to store one or more bits of data. In one embodiment, storage media refers to physical storage cells and/or memory cells used in volatile memory media. In another embodiment, storage media refers to physical storage cells and/or memory cells used in non-volatile memory media.

Examples of non-volatile memory 118 include but are not limited to: ReRAM, Memristor memory, programmable metallization cell memory, phase-change memory (PCM, PCME, PRAM, PCRAM, ovonic unified memory, chalcogenide RAM, or C-RAM), NAND FLASH memory (e.g., 2D NAND FLASH memory, 3D NAND FLASH memory), NOR FLASH memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like.

While the non-volatile memory 118 may be referred to herein as "memory media," in various embodiments, the non-volatile memory 118 may more generally be referred to as non-volatile memory. Because non-volatile memory 118 is capable of storing data when a power supply is removed, the non-volatile memory 118 may also be referred to as a recording media, non-volatile recording media, storage media, storage, non-volatile memory, volatile memory medium, non-volatile storage medium, non-volatile storage, or the like.

In certain embodiments, data stored in non-volatile memory 118 is addressable at a block level, which means that the data in the non-volatile memory 118 is organized into data blocks that each have a unique logical address (e.g., LBA). In other embodiments, data stored in non-volatile memory 118 is addressable at a byte level which means that the data in the non-volatile memory 118 is organized into bytes (8 bits) of data that each have a unique address, such as a logical address. One example of byte addressable non-volatile memory 118 is storage class memory (SCM). Non-volatile memory 118 within a memory system 100 may comprise single-level storage cells (SLC), multi-level storage cells (MLC), or a combination of the two.

"Single-level storage cell" refers to a storage cell configured to store a single binary bit that represents a data value. Single-level storage cell may be abbreviated using the term "SLC." "Multi-level storage cell" refers to a storage cell configured to store a two or more binary bits that each represents a distinct data value. Multi-level storage cell may be abbreviated using the term "MLC." In certain embodiments, an MLC stores two binary bits. In another embodiment, MLC may refer to storage cells that store three or more binary bits.

In still other embodiments, other terms may be used to distinguish one set of MLC storage cells from another. In such embodiments, MLC storage cells may refer specifically to storage cells storing two-binary bits per storage cell, out of industry convention. In such embodiments, storage cells that store three binary bits per storage cell may be identified as three-level cell storage cells, or TLC, for three or Tertiary levels. Storage cells that store four binary bits per storage cell may be identified as four-level cell storage cells, or QLC, for four or Quad levels. Storage cells that store five binary bits per storage cell may be identified as five-level cell storage cells, or PLC, for five or Penta levels. A similar naming convention may be used for storage cells that store six or more binary bits per storage cell.

Figure 2:
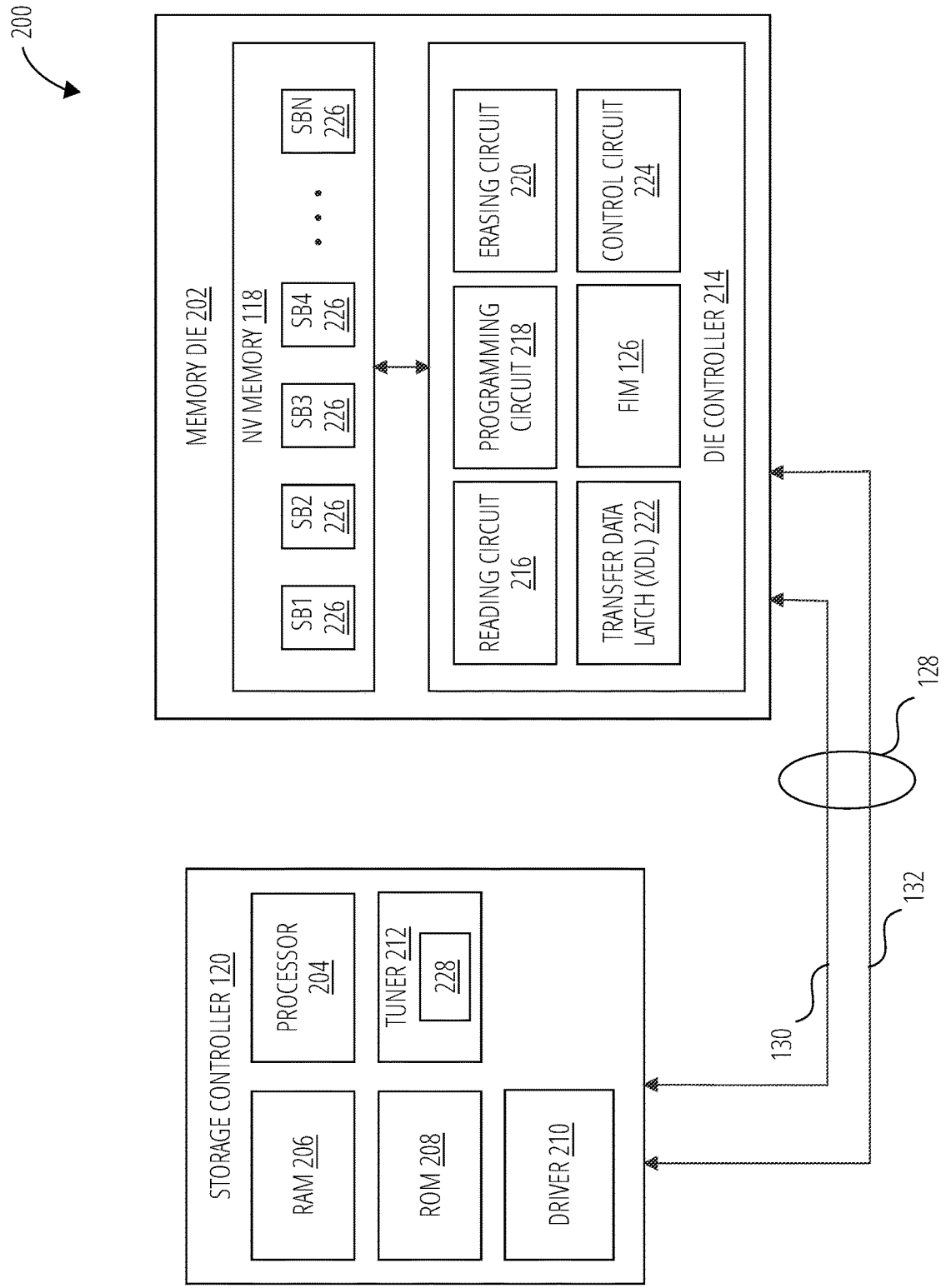
FIG. 2 is a block diagram of an example memory system 200 that implements methods to improve the rate at which data can be stored in the memory system.

FIG. 2 is a block diagram of an exemplary memory system 200. In this embodiment, the memory system 200 comprises a storage controller 120 and a memory die 202. In an embodiment, memory die 202 may comprise one of a plurality of memory die that together serve as the non-volatile memory 118 of FIG. 1. The storage controller 120 and the memory die 202 may be coupled by a memory interface 128 comprising a data bus 130 and control bus 132. Those of skill in the art will recognize that while FIG. 2 illustrates a memory interface 128 connecting a single storage controller 120 and a single memory die, certain embodiments, may include a plurality of memory die 202 coupled via a single shared memory interface 128 to a storage controller 120. By way of example and without limitation, data communication via a parallel byte-wide data bus is described. Other bus widths are contemplated.

The storage controller 120 may utilize a toggle mode interface communication protocol to read from, and write data to, non-volatile memory 118 via the memory interface 128. In one embodiment, user data and command and address data may be transferred over the data bus 130. The control bus 132 may be used to activate or deactivate certain memory die or chips, and to signal what type of data is being sent on the data bus 130, and/or to provide a clock signal, such as a strobe signal to manage the transfer of data on one or both of the data bus 130 and the control bus 132. In one embodiment, storage operations generated by the storage controller 120 may be communicated to the memory die 202 via data bus 130. The storage operations may include write commands to write data to memory die 202, read commands to read data from memory die 202 and/or maintenance commands to control the operation of the memory die 202 and/or the memory interface 128.

By way of example and without limitation, in one embodiment, storage controller 120 includes a processor 204, RAM 206, ROM 208, driver 210, and tuner 212. The processor 204 may comprise a microprocessor, a microcontroller, an application specific integrated circuit (ASIC), a field programmable gate array, a logical digital circuit, or other now known or later developed logical processing capability. Storage controller 120 may correspond to storage controller 120 of FIG. 5 in an embodiment.

The RAM 206 may store or buffer data that passes through the storage controller 120. Additionally, and/or alternatively, the RAM 206 may store other data used by the storage controller 120 to complete storage operations.

ROM 208 may store software instructions that processor 204 may execute to control the operation of memory system 200. In an embodiment, ROM 208 may also store software instructions corresponding to perform read and write tuning of the interface between storage controller 120 and memory die 202. In an embodiment, ROM 208 may also include instructions that when executed by processor 204 perform the functionality logically ascribed to host interface manager 112 (HIM), controller firmware 124 and flash interface manager 126.

The driver 210 provides voltages and/or current on the data bus 130 and/or control bus 132 in an appropriate sequence and appropriate timing to convey data to the memory die 202 according to the memory interface 128. "Driver" refers to a circuit, sub-circuit, electronic component, hardware, software, firmware, module, logic, device, or apparatus configured, programmed, designed, arranged, or engineered to supply a voltage, either in analog or digital wave form, to another circuit, sub-circuit, electronic component, logic, device, or apparatus. The driver 210 may supply a current to another circuit or component at a predefined level/magnitude. Often, a single driver, also referred to herein as a "driver circuit," is configured to supply a voltage and/or current at one of a plurality of predefined levels or magnitudes, based on instructions from the storage controller 120.

The tuner 212 may be configured to use a default data transfer speed 228 for communicating via the memory interface 128. "Tuner" refers to a hardware, device, component, element, circuitry, logic, or circuit configured to adjust a setting, characteristic, parameter, attribute, or the like in a manner that improves performance, accuracy, and/or operation of a set of logic, circuit, software, hardware, firmware, system, sub-system, device, apparatus, or logic unit, component, device, or component. "Data transfer speed" refers to a measure of a rate at which data is transferred between a source and a destination relative to a unit of time, typically seconds or portions of seconds. A data transfer speed may be expressed in terms of the number of clock cycles of a clock signal, such as a strobe signal, of a communication interface, such as a data bus. A data transfer speed may be expressed in terms of the amount of data in Mega Bytes transferred per unit of time, such as seconds. For example, one data transfer speed may be 533 MB/s. "Strobe signal" refers to a digital electric signal applied to a control line by a driver and configured to raise a voltage and/or current of the control line. In certain embodiments, a strobe signal is configured to oscillate between an elevated level and a non-elevated level, and the oscillation occurs over a regular period defined as cycles. Such oscillating strobe signals may serve as a clock, or clock signal, for transferring data in a digital circuit. "Interface" refers to a protocol and associated circuits, circuitry, components, devices, systems, sub-systems, and the like that enable one device, component, or apparatus to interact and/or communicate with another device, component, or apparatus.

A default data transfer speed 228 may be set such that data transferred over the memory interface 128 having a high bit error rate for transmission will still be recoverable by logic of the storage controller 120. Said another way, the default data transfer speed 228 may be set and/or tuned by the tuner 212 to cover a "worst case" data transfer such that the data (the message) is recoverable by the receiver.

The default data transfer speed 228 may in one embodiment be tuned or set by adjustments to a clock rate for a clocking signal such as a strobe signal, an impedance manager, a duty-cycle correction module, and/or on-die termination values for physical traces of the data bus 130 and control bus 132. A default data transfer speed 228 may be determined by writing test data to the non-volatile memory 118 over the memory interface 128, reading the test data back, and determining a bit error rate for the test data. "Test data" refers to a set of data configured to test the operation and/or performance of one or more components, circuits, systems, sub-systems of a device, circuit, storage cells, apparatus and/or interface(s), such as a memory interface.

In an exemplary embodiment, memory die 202 includes non-volatile memory 118 and die controller 214. In one embodiment, non-volatile memory 118 comprises NAND flash memory. In this embodiment, non-volatile memory 118 is organized as N storage blocks 226 SB1 to SBN. "Storage block" refers to a set of storage cells organized such that storage operations can be performed on groups of storage cells in parallel. The organization of the set of storage cells may be implemented at a physical level or a logical level. Thus, a storage block, in one embodiment, may comprise a physical page, such as a word line, a logical page comprising physical pages that span planes and/or memory die, a physical erase block comprising a set of physical pages, a logical erase block (LEB) comprising a set of logical pages, or the like. A storage block may be referred to herein as a "block", a "memory block" or a LEB. A page, logical or physical, is a smallest unit of writing in the non-volatile memory 118 and a storage block is the smallest unit of erasing. Thus, data is typically programmed or stored on a logical page by logical page basis. However, erasing data programmed in a logical page may require erasure of all the logical pages in the storage block. Data received from the host 102 is typically programmed or stored in an erased storage block.

In certain embodiments, the memory die 202 may use, or configure, certain storage blocks 226 to have storage cells that store a single binary bit values per storage cell (i.e., SLC storage blocks) and other storage blocks 226 to include storage cells that store a multiple binary bit values per storage cell (i.e., MLC storage blocks). For example, in one embodiment, ten percent of the storage blocks 226 may be SLC storage blocks, while 90 percent of the storage blocks 226 may be MLC storage blocks. By designating the storage blocks 226 in this manner, each logical page of an SLC storage block may include a single-level cell (SLC) storage cells and each logical page of an MLC storage block may include multi-level (MLC) storage cells. Typical sizes of logical pages may be 16 Kilobytes (Kbytes). A storage block 226-1 for example, typically consists of thousands of logical pages.

In an embodiment, die controller 214 includes programming circuit 218, reading circuit 216, erasing circuit 220, control circuit 224, flash interface manager 126 and transfer data latch (XDL) 222. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The transfer data latch (XDL) 222 functions as intermediate data storage between storage controller 120 and memory die 202. Flash interface manager 126 may coordinate with the tuner 212 to establish default data transfer speed 228 and a set of default interface settings for the memory interface 128. In one embodiment, transferring data read from MLC storage cells may include a higher bit error rate than reading SLC storage cells. Consequently, the flash interface manager 126 and tuner 212 may adjust the interface settings, including a default data transfer speed 228 such that as few errors as possible, and practical, are introduce by way of a transfer of MLC data (i.e. Data from MLC storage cells) across the memory interface 128. In this manner, the flash interface manager 126 and tuner 212 work to reduce a number of bit errors in data read from MLC storage cells.

In an embodiment, the reading circuit 216 of FIG. 2 translates the amount of charge stored in a memory cell to a binary representation of the data corresponding to the amount of charge stored in the cell. By way of example and without limitation, the reading circuit 216 may include current to voltage convertors, amplifiers and analog to digital convertors.

The programming circuit 218 of FIG. 2 translates the binary representation of data received from host 102 into programming voltages and periods. The programming circuit applies these programming voltages for the periods programming periods to memory cells to cause the memory cells to store electric charge. The amount of stored electric charge is representative of the binary representation of the received data.

Writing the data to transfer data latch (XDL) 222 may be performed via data bus 130. Separately, storage controller 120 may control the writing of the data by activating control bus 132 and/or sending control signals on the control bus. Data may be written via data bus 130 in toggle mode as described above. Reading data may also be performed via the data bus 130 by activating control bus 132, CE # line 528 for example, in toggle mode.

In an embodiment, control circuit 224 is configured to interpret previously described commands received from the storage controller 120. In an exemplary embodiment, in response to being instructed by host 102 to write data to non-volatile memory 118, storage controller 120 may issue a write command via data bus 130. The storage controller 120 may subsequently write the data to transfer data latch (XDL) 222. The control circuit 224 may interpret the received command as a write command and cause the programming circuit 218 to write the data from transfer data latch (XDL) 222 to an appropriate memory block and erased memory page of non-volatile memory 118. Similarly, when instructed to read data from a specified memory page, storage controller 120 may issue a read command. "Read command" refers to a type of storage command that reads data from memory cells.

The control circuit 224 may interpret the received command as a read command and cause reading circuit 216 to read data from the specified memory page into the transfer data latch (XDL) 222 and storage controller 120 the read data from the transfer data latch (XDL) 222 to RAM 206. The exchange of data may be performed using legacy mode or toggle mode or a combination thereof. For example, data may be read using the toggle mode and writing of data may be performed using the legacy mode.

Figure 3:
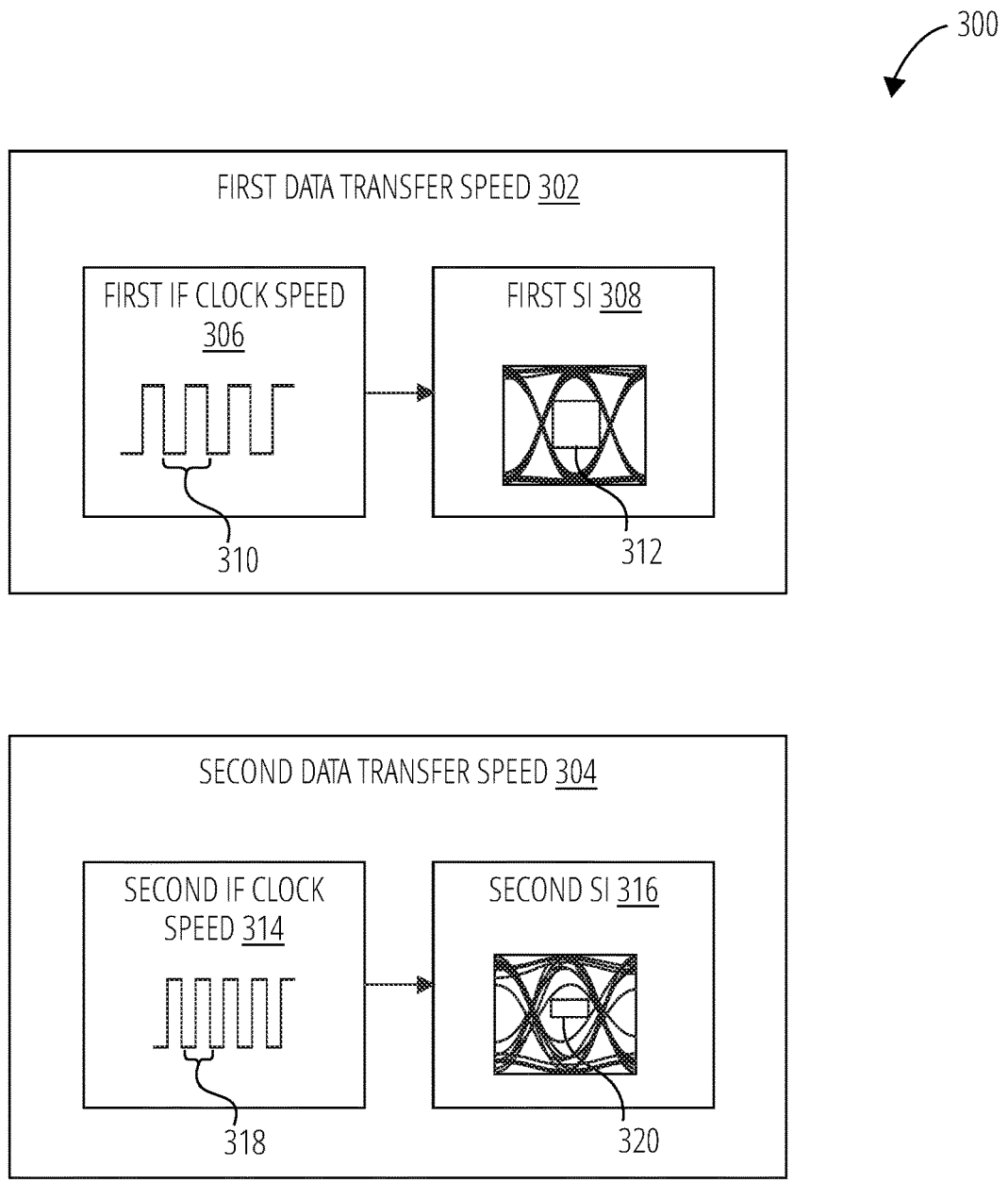
FIG. 3 illustrates attributes of data transfer speeds 300 in accordance with one embodiment.

FIG. 3 shows attributes relating to data transfer speeds 300 in accordance with one embodiment. Each data transfer speed may be characterized by an interface clock speed and a resulting signal integrity. "Interface clock speed" refers to a type of interface characteristic that defines a clock speed for a control signal configured to serve as a clock signal for a communication interface. "Signal integrity" refers to a set of measures of the quality of an electrical signal. In digital electronics, a stream of binary values is represented by a voltage (or current) waveform. However, digital signals are fundamentally analog in nature, and all signals are subject to effects such as noise, distortion, and loss.

Over short distances and at low bit rates, a simple conductor can transmit this with sufficient fidelity. At high bit rates and/or over longer distances or through various mediums, various effects can degrade the electrical signal to the point where errors occur, and the system or device fails. (Search "signal integrity" on Wikipedia.com Oct. 7, 2019. Modified. Accessed Feb. 4, 2020.) Signal integrity is a measure for how much a message or data value or signal is influenced by interference and/or signal degradation as it is communicated between a source and a destination.

SLC storage cells have a different signal integrity than MLC storage cells when measured with respect to reading or sensing the data values from the storage cells of the non-volatile memory 118. This difference in signal integrity may be measured by calculating a bit error rate for the data sensed/read from the SLC or MLC storage cells. Specifically, the signal integrity is worse for MLC storage cells because the memory states associated with each storage cell that identify the associated data bit value are more susceptible to errors when the reading circuit 216 reads the MLC storage cells. Errors due to reading of storage cells are referred to herein as an intrinsic bit error rate. In one embodiment, MLC storage cells may have an intrinsic bit error rate of 0.4%. In contrast, SLC storage cells may have an intrinsic bit error rate of 0.1%. Errors generated during reading of storage cells may be detected and corrected by a decoder (not shown) of the storage controller 120.

Embodiments, disclosed herein, may leverage a difference in intrinsic bit error rates between SLC storage cells and MLC storage cells to change memory interface settings depending on whether the data is being read from/written to SLC storage cells or MLC storage cells. In certain embodiments, the storage controller 120 may change a data transfer speed based on data is being read from/written to SLC storage cells or MLC storage cells. "Single-level cell signal integrity threshold" refers to a threshold that identifies a suitable signal integrity for storage operations, such as a read operation, that involves single-level storage cells. As used herein, a suitable signal integrity is one for which a controller or system is capable of compensating for a tolerable number of errors introduced due to the suitable signal integrity. "Multi-level cell signal integrity threshold" refers to a threshold that identifies a suitable signal integrity for storage operations, such as a read operation, that involves multi-level storage cells.

"Memory state" refers to a condition of a memory cell designed and/or configured to represent an encoding for one or more data bit values. In certain embodiments, the memory state may be changed using a storage operation. In a non-volatile memory cell, the memory cell maintains its memory state without a power source.

As a tuner determines a suitable data transfer speed, the tuner may determine multiple data transfer speeds and select from these, a data transfer speed that provides a desired level of performance with a highest signal integrity, and a fewest number of errors.

FIG. 3 illustrates a few example data transfer speed to illustrate differences between them. Tuner 212 may determine a first data transfer speed 302 and a second data transfer speed 304. The first data transfer speed 302 may be characterized by a first interface clock speed 306 and a first signal integrity 308. The second data transfer speed 304 may be characterized by a second interface clock speed 314 and a second signal integrity 316.

The frequency of an interface clock speed may directly impact the signal integrity of signals traveling at that interface clock speed over a data bus. As interface clock speeds increase, signals have less time to transition between logical states in order to reach a stable, determinable, recognizable value in time to be clocked, or latched, into a circuit (e.g., a flip-flop circuit). An "eye opening" refers to a visually observable timing phenomenon where multiple signals can be seen to transition cleanly with regard to their clocking speed resulting in a larger area of open space visible in the "signal eye", or where these signals do not transition as cleanly, narrowing the open space in the signal eye.

As illustrated in FIG. 3, a lower frequency 310 setting for the first interface clock speed 306 may provide a first signal integrity 308 characterized by a larger eye opening 312. The larger eye opening 312 is indicative of higher, or better, signal integrity. A higher frequency 318 setting for the second interface clock speed 314, in turn, may result in a smaller eye opening 320. The smaller eye opening 320 is indicative of lower, or worse, signal integrity.

Figure 4:
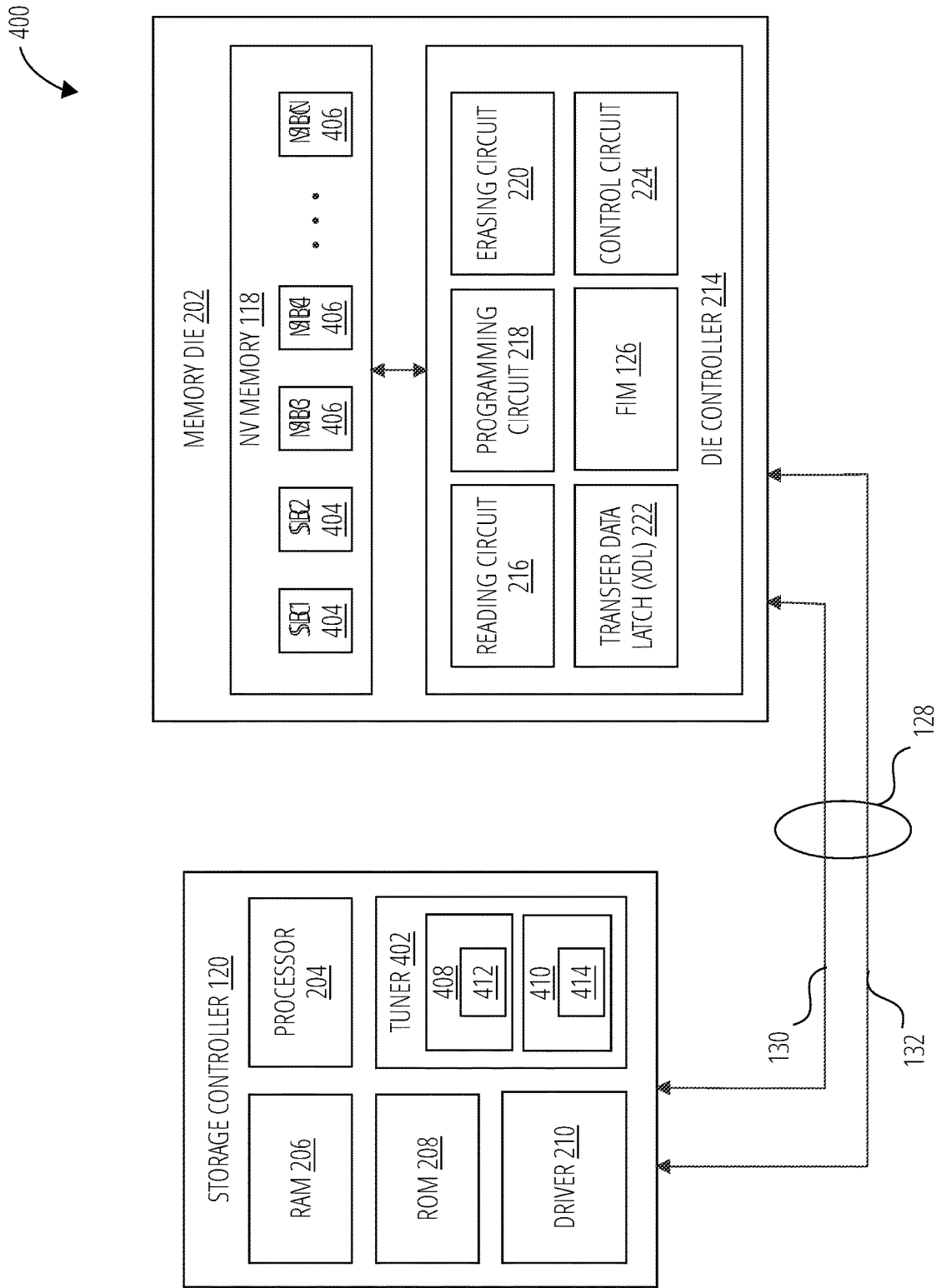
FIG. 4 is a block diagram of an example memory system 400 that implements methods to improve the rate at which data can be stored in the memory system.

FIG. 4 illustrates a memory system 400 in accordance with one embodiment. The memory system 400 may comprise a memory die 202, a storage controller 120, a processor 204, a RAM 206, a ROM 208, a non-volatile memory 118, a reading circuit 216, a programming circuit 218, an erasing circuit 220, a transfer data latch (XDL) 222, a memory interface 128 comprising a data bus 130 and a control bus 132, a control circuit 224, and a driver 210. These components may be embodied as described for analogous components illustrated in FIG. 1 and FIG. 2. The illustrated embodiment further includes a die controller 214, a tuner 402, and a flash interface manager 126.

In one embodiment, the non-volatile memory 118 may includes storage blocks that are set up or configured to operate as SLC storage blocks 404 and MLC storage blocks 406 as illustrated, each SLC storage block 404 comprising storage cells storing a single bit of data per storage cell and each MLC storage block 406 comprising storage cells storing more than one bit of data per storage cell.

In certain embodiments, the memory system 400 may expose, or advertise, to a host 102 that certain storage blocks are SLC storage blocks 404 and other storage blocks are MLC storage blocks 406. In other embodiments, the host 102 is unaware that the memory system 400 is storing certain data in SLC storage blocks 404 and other data in MLC storage blocks 406. In such an embodiment, the storage controller 120 may determine what data is written to an SLC storage block 404 and which data is written to an MLC storage block 406. Storage operations implemented on this memory system 400, therefore, may involve either type of storage block. As described above, storage operations involving SLC storage blocks 404 incur higher overhead (data transfer execution time as a percentage of programming execution time) than MLC storage blocks 406. The two types of memory also, as earlier described, have different signal integrity requirements.

The tuner 402 of the storage controller 120 may be configured to tune the memory interface 128 in order to effectively transfer data for storage cells configured within MLC storage blocks 406 and to effectively transfer data for storage cells configured within SLC storage blocks 404. To this end, the tuner 402 may determine, and/or generate, both multi-level cell settings 408 and single level cell settings 410. The multi-level cell settings 408 may include a multi-level storage cell data transfer speed 412 and the single level cell settings 410 may include a single-level storage cell data transfer speed 414. In one embodiment, the tuner 402 determines the multi-level cell settings 408 and single level cell settings 410 by an iterative process of sending test data and receiving test data and determining the bit error rate for the transfer and then adjusting the interface settings to reduce the bit error rate.

In one embodiment, the tuner 402 tunes the memory interface 128 to determine appropriate interface settings for transferring data, with an acceptable signal integrity and bit error rate and data transfer speed. The tuner 402 may tune the memory interface 128 for transfer of data for storage cells configured to store more than one bit per storage cell and generate the associated multi-level cell settings 408. Additionally, the tuner 402 may tune the memory interface 128 for transfer of data for storage cells configured to store more a single bit per storage cell and generate the associated single level cell settings 410. Those of skill in the art will recognize that the tuner 402 may determine interface settings for storage cells configured to store any number of bits per storage cell, such as 2, 3, 4, 5, 6, 7, 8, and the like. Similarly, embodiments of the disclosed solution may change the interface settings, as needed based on the number of bits the storage cells involved in the storage operation are configured to store.

Once the multi-level cell settings 408 and single level cell settings 410 are determined either by tuner 402 or by another module or component, the memory system 400 may use either set of interface settings to service read commands and write commands for data on non-volatile memory 118.

"Multi-level cell settings" refers to a parameter for, or related to, interacting with, using, operating, or managing multi-level storage cells. The multi-level cell settings may relate to writing to, or programming, storage cells, reading from storage cells, erasing storage cells, managing storage cells, device driver or storage controller settings for storage cells, or the like.

Multi-level cell settings, in certain embodiments, may include one or more storage thresholds, such as a read voltage threshold (a set of sensing values used to read data from a storage cell), a resistivity threshold, a programming threshold (a set of one or more threshold voltage level values used to write/program data to a storage cell), an erase threshold, a hardware driver level threshold, a storage controller level threshold, or the like.

The multi-level cell settings may be set once during initialization of storage media, dynamically with each command issued to the storage media, or during operation of the storage media in response to triggers such as events or time intervals.

"Multi-level storage cell data transfer speed" refers to a data transfer speed configured specifically for transfer of data to, or from, a multi-level storage cell.

"Single level cell settings" refers to a parameter for, or related to, interacting with, using, operating, or managing single-level storage cells. The single level cell settings may relate to writing to, or programming, storage cells, reading from storage cells, erasing storage cells, managing storage cells, device driver or storage controller settings for storage cells, or the like.

Single level cell settings, in certain embodiments, may include one or more storage thresholds, such as a read voltage threshold (a set of sensing values used to read data from a storage cell), a resistivity threshold, a programming threshold (a set of one or more threshold voltage level values used to write/program data to a storage cell), an erase threshold, a hardware driver level threshold, a storage controller level threshold, or the like.

The single level cell settings may be set once during initialization of storage media, dynamically with each command issued to the storage media, or during operation of the storage media in response to triggers such as events or time intervals.

"Single-level storage cell data transfer speed" refers to a data transfer speed configured specifically for transfer of data to, or from, a single-level storage cell.

Figure 5:
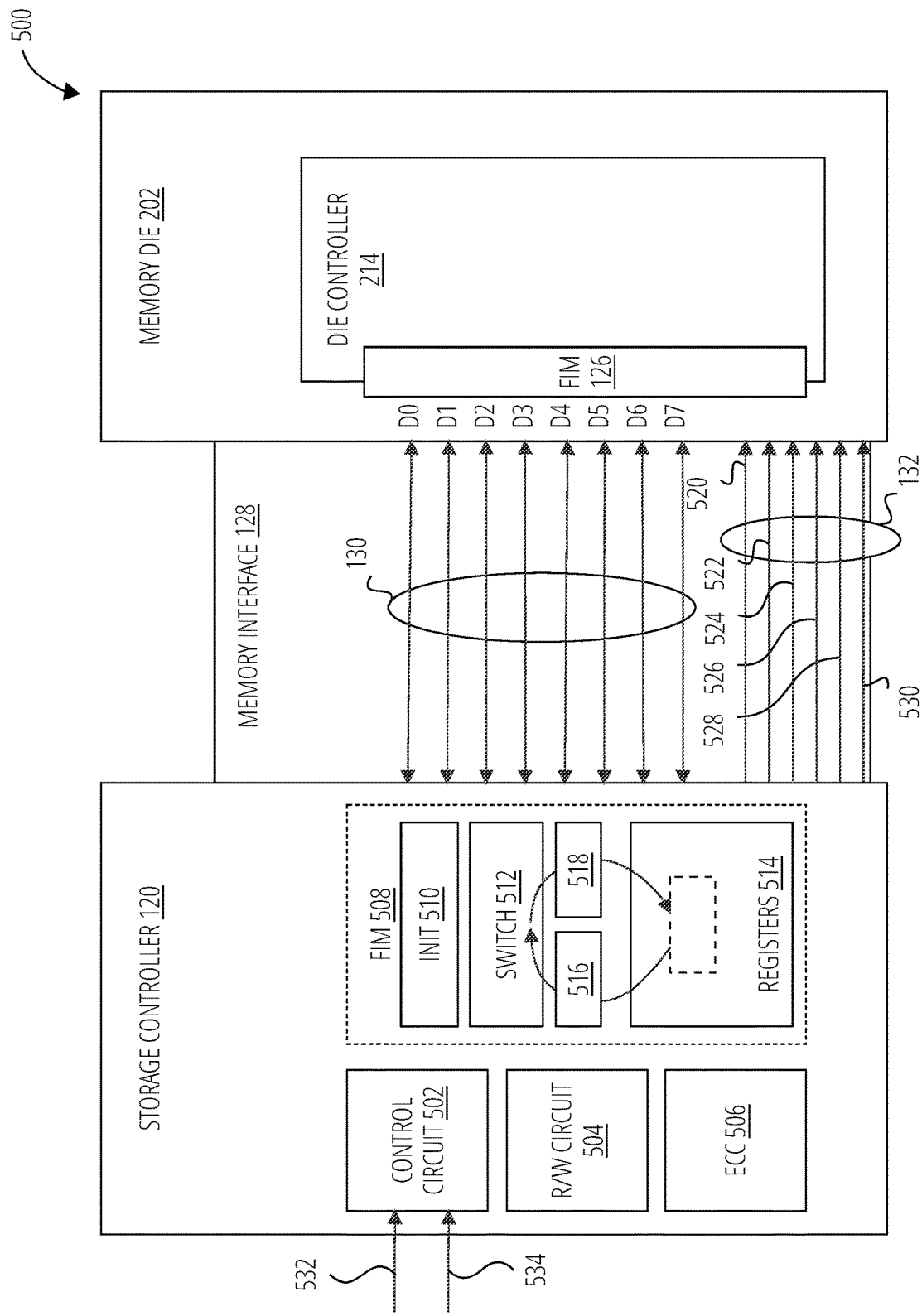
FIG. 5 is a block diagram of an exemplary memory system 500 comprising a storage controller and die controller that may exchange information using the several operating modes disclosed herein.

FIG. 5 is a block diagram of a memory system 500. The memory system 500 depicts an exemplary system that may change a memory die interface based on a type of storage cell being accessed. In an exemplary embodiment, storage controller 120 includes a control circuit 502, a read-write circuit 504, an error correction circuit 506, and a flash interface manager 508.

The control circuit 502 may interface with a host 102 and receive incoming commands for storage operations and manage other circuits and modules of the storage controller 120 to service the commands. The control circuit 502 may include logic, firmware, and/or software and may be implemented in a processor.

The read-write circuit 504 operates to instruct the die controller 214 to perform device specific actions, such as storage operations on non-volatile memory 118. "Read-write circuit" refers to a device, component, element, module, system, sub-system, circuitry, logic, hardware, or circuit configured and/or operational to read data from and write data to a storage media, such as storage cells of a storage array.

The error correction circuit 506 in one embodiment may be configured to correct one or more errors of the data read by the read-write circuit 504 in response to the first read command 532. "Error correction circuit" refers to a device, component, element, module, system, sub-system, circuitry, logic, hardware, or circuit configured and/or operational to detect and optionally correct one or more errors in a set of data.

The error correction circuit, in one embodiment, may comprise one or more types of decoders, including, but not limited to, a low density parity check (LDPC) decoder, a Reed-Solomon code decoder, a Golay code decoder, a Bose Chaudhuri Hocquenghem (BCH) code decoder, a turbo code decoder, a multidimensional parity code decoder, a Hamming code decoder, a Hadamard code decoder, an expander code decoder, a Reed-Muller code decoder, a Viterbi decoder, a Fano decoder, or the like.

The flash interface manager 508 may comprise an initialization circuit 510, a switch circuit 512, and control registers 514. The initialization circuit 510 may be configured to load multi-level cell settings 516 in order to configure the memory interface 128 for transfer of data for storage cells configured to store more than one bit per storage cell (MLC storage blocks). Alternatively, or in addition, the initialization circuit 510 may be configured to load single level cell settings 518 in order to configure the memory interface 128 for transfer of data for storage cells configured to store a single bit value per storage cell (SLC storage blocks).

"Initialization circuit" refers to a device, component, element, module, system, sub-system, circuitry, logic, hardware, or circuit configured and/or operational to configure and perform operations for a device, component, element, module, system, sub-system, circuitry, logic, hardware, or circuit to begin normal operations after a shutdown or power off or sleep event.

In certain embodiments, an initialization circuit may configure certain settings, interfaces or other components in order to facilitate the operation and function of one or more devices, components, elements, modules, systems, sub-systems, hardware, circuits, or the like.

The switch circuit 512 manages which interface settings are in use during operation of the storage controller 120. "Switch circuit" refers to a device, component, element, module, system, sub-system, circuitry, logic, hardware, or circuit configured to change, exchange or switch settings for one or more control registers or other storage media such that any existing settings or values are replaced by new or different settings or values.

In one embodiment, the control registers 514 store the interface settings that are currently being used (illustrated by the dashed rectangle within the control registers 514 box) for the memory interface 128. "Control registers" refers to a set of one or more hardware registers configured to store interface settings for use by a memory interface to send and receive data and control signals over the memory interface. "Hardware register" refers to circuits, typically composed of flip flops, that are configured to serve as high speed memory. Hardware registers may include one or more characteristics of memory (volatile or non-volatile), such as: the ability to read or write multiple bits at a time, and an ability to use an address to select a particular register in a manner similar to a memory address. (Search hardware register on Wikipedia.com Jan. 9, 2020. Modified. Accessed Feb. 5, 2020.)

Hardware registers may be configured for in an interface between two or more electronic components, circuits, die, chips, or the like. For example, hardware registers may be used to hold interface settings for use in an interface between two components or circuits. Id.

Similarly, or in addition, in one embodiment, hardware registers may be used as an interface between a state machine, firmware, and/or software and one or more other components such as peripherals. In such an embodiment, software may write data to hardware registers in order to send information to a device, and may read data from hardware registers to get information from the device. Id.

"Interface settings" refers to a parameter for, or related to, interacting with, using, operating, or managing a communication interface, such as a memory interface. The interface settings may relate to settings configured to ensure accurate sending and receiving of data and/or control signals between a sender and a receiver.

For an interface that uses a set of control lines to communicate the data and signals, the interface settings may include parameters, values, and settings that adjust the operation of the interface to improve the performance, the fidelity, and the signal integrity of the interface. Some examples of settings that may be interface settings includes, but is not limited to, impedance (ZQ) matching settings, on-die termination (ODT) settings, such as delay settings, duty-cycle correction settings, interface clock speed settings, and the like. In certain embodiments, interface settings may be defined and or adjusted to account for differences in circuits or components that result from process manufacturing variances, changes in voltages used or available, and changes in temperature in which the sender and/or receiver operate.

The interface settings may be set once during initialization of a sender and/or receiver configured to use the associated interface, dynamically with each command issued by way of the interface, or during operation of the sender and receiver using the interface in response to triggers such as events, time intervals, conditions that meet thresholds, and the like.

During operation of the storage controller 120, the flash interface manager 508 may store the multi-level cell settings 516 and single level cell settings 518 in volatile memory, such as RAM 206. When the memory system 500 is not operating, the flash interface manager 508 may store multi-level cell settings 516 and single level cell settings 518 appropriate to the storage block configurations in non-volatile memory 118 of the memory die 202.

The memory interface 128 serves as a communication bridge between the storage controller 120 and the memory die 202. The memory interface 128 couples the flash interface manager 508 of the storage controller 120 to a flash interface manager 126 of the memory die 202. The memory interface 128 may operate according to an industry standard protocol or a proprietary protocol. In one embodiment, the memory interface 128 may be configured to transfer data using a double data rate protocol with both the multi-level cell settings 516 and the single level cell settings 518.

"Double data rate protocol" refers to a communication bus protocol configured to transfer data from a sender to a receiver on both the rising edge and the falling edge of a clock signal or strobe signal. A double data rate protocol may be abbreviated "DDRx" where x represents the generation for the protocol (e.g., DDR2 is a 2nd generation double data rate protocol). A double data rate protocol may also be referred to as a "double pumped", "dual-pumped", "double transition" protocol. A double data rate protocol may also be referred to as a toggle mode, particularly when used with a memory interface.

A double data rate protocol is configured and capable of transferring twice as much data as a single data rate protocol (abbreviated "SDR"), which is configured to transfer data on either the rising edge or the falling edge of a clock signal.

The memory interface 128 may include a data bus 130 and a DQS line 530, which may be part of the control bus 132 comprising control lines. "Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like. Control line may convey strictly data signals, strictly command or control signal, and/or a combination of both.

In some embodiments, the control bus 132 includes a read enable line (RE line 520), write enable line (WE line 522), command latch enable line (CE line 524), address latch enable line (CA line 526), chip enable line (CE # line 528), and clock signal, such as a strobe signal, also referred to as a strobe line, (DQS line 530). "Strobe line" refers to a control line configured to deliver a strobe signal. In certain embodiments, the control bus 132 may include a ready/busy control line (not shown) that the die controller 214 manages to signal to the storage controller 120 whether or not the memory die 202 is busy doing a storage operation and unavailable to service new commands. Also, in certain embodiments, a control bus 132 may include a reset line (not shown) that the storage controller 120 may be used to reset or "reboot" the memory die 202.

To write data, storage controller 120 writes the data to data bus 130 and activates the WE line 522, among control lines. Storage controller 120 may write data by driving certain data lines high i.e. D1, D3, D5 and D7. The data lines asserted high may not instantaneously transition to the active high state. Instead the transition may occur gradually. The voltage transitions on the different data lines may have different slopes, in part because of differing electrical and transmission characteristics of the different data control lines. The rate of change of the voltage or slope of the voltage transition may be referred to as the slew rate of the control line.

Memory storage controller 120 may delay the driving the signal on the WE line 522 to ensure, in part, that the voltage levels on the data lines are stable and that the data lines are in the logic state corresponding to the data being written. The length of this delay is one example of an interface settings that may be a part of the multi-level cell settings 516 and/or single level cell settings 518.

In one embodiment, when the signal level on the WE line 522 exceeds a voltage threshold, die controller 214 may latch the state of the data lines and read the latched data. In an exemplary embodiment, WE line 522 may be activated corresponding to the time when the signal levels on the data lines D0-D7 have reached their steady state levels.

The control circuit 502 may be configured to receive a first read command 532 that references storage cells of a memory die that store only a single bit per storage cell (e.g., SLC storage blocks 404). In one embodiment, the control circuit 502 determines that the data for the first read command 532 is stored on an SLC storage block 404. Consequently, the control circuit 502 may signal the switch circuit 512 to switch settings for the memory interface 128 from the multi-level cell settings 516 to single level cell settings 518.

Advantageously, this switching, or changing, of the interface settings may take just a few nanoseconds. Therefore, the overhead to do the switch imposes little, to no, overhead on the overall read operation time. With the interface settings changed to the single level cell settings 518, the read-write circuit 504 then reads data over the memory interface 128 using these single level cell settings 518. In one embodiment, the single level cell settings 518 include a faster data transfer speed than the data transfer speed for the multi-level cell settings 516, with the tradeoff that the signal integrity for the single level cell settings 518 is lower than the signal integrity for the multi-level cell settings 516.

In one embodiment, the switch circuit 512 may be configured to automatically switch settings for the memory interface 128 from single level cell settings 518 back to multi-level cell settings 516 in response to the read-write circuit 504 reading the data for the first read command 532. That is, once the data from SLC storage block has been read, the switch circuit 512 would automatically prepare the memory interface 128 for subsequent MLC storage block operations.

In one embodiment, the control circuit 502 may be configured to receive a second read command 534 subsequent to the first read command 532 referencing storage cells storing more than one bit (MLC memory). In response to the second read command 534, the switch circuit 512 may be configured to switch the memory interface 128 settings to the multi-level cell settings 516 in response to the second read command 534 referencing storage cells storing more than one bit per storage cell.

In various embodiments, setting, or tuning, the data transfer speed of the memory interface as described with regard to FIG. 4 may comprise loading control registers 514 with interface settings configured to increase an interface clock speed of the memory interface. In this manner, the switch circuit 512 is configured to move multi-level cell settings 516 and single level cell settings 518 into, and out of, control registers 514.

The single level cell settings 518 implemented by the memory interface 128 in response to the first read command 532 may be configured to reduce signal integrity and increase data transfer speed for the data read by the read-write circuit 504 under these conditions. This data transfer speed for SLC memory may be configured to be higher than the data transfer speed associated with the multi-level cell settings 516 for MLC memory. In one embodiment, the error correction circuit 506 is configured to perform error correction to compensate for the reduced signal integrity when single level cell settings 518 are used, for example to service the first read command 532.

Figure 6:
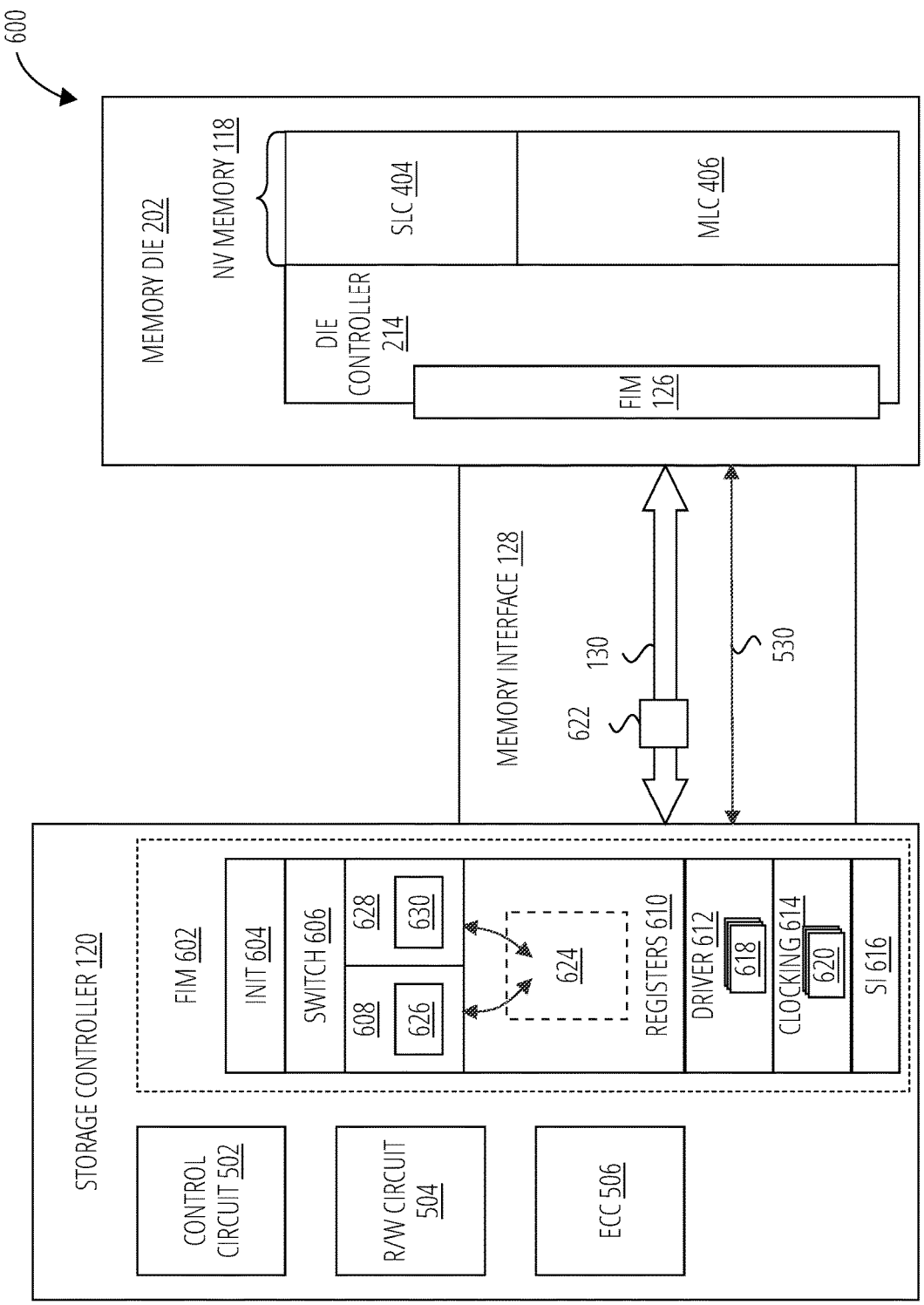
FIG. 6 is a block diagram of an exemplary memory system 600 comprising a storage controller and die controller that may exchange information using the several operating modes disclosed herein.

FIG. 6 illustrates a memory system 600 in accordance with one embodiment. The memory system 600 may comprise a storage controller 120 and memory die 202 connected via a memory interface 128, similar to previously illustrated embodiments. The storage controller 120 may comprise a flash interface manager 602 that incorporates an initialization circuit 604, a switch circuit 606, control registers 610, a driver 612, a clocking circuit 614, and a signal integrity circuit 616. The initialization circuit 604, switch circuit 606, and control registers 610 of the storage controller 120 flash interface manager 602 may be embodied as described with regard to analogous elements of FIG. 5.

The driver 612 may be coupled to the data bus 130 and DQS line 530 of the memory interface 128. The driver 612 may be characterized by a plurality of data transfer speeds 618. Each of the plurality of data transfer speeds 618 may present a different signal integrity (see FIG. 3). The driver 612 may be operable to adjust a data transfer speed of the data bus 130, for example by adjusting a frequency of the DQS line 530.

The flash interface manager 602 may include a clocking circuit 614. The clocking circuit 614 may be characterized by a set of interface clock speeds 620. The clocking circuit 614 may be operable to reduce the data transfer speed by delaying transmission of a strobe signal (or clock signal) communicated by the DQS line 530. The flash interface manager 602 may include a signal integrity circuit 616 configured to determine a signal integrity for the memory interface 128 at a particular data transfer speed. "Signal integrity circuit" refers to a device, component, element, module, system, sub-system, circuitry, logic, hardware, or circuit configured and/or operational to determine, identify, detect, sense, or calculate, a signal integrity for one or more data signals communicated between a source and a destination. In one embodiment, a signal integrity circuit may determine a signal integrity for a communication interface such as a memory interface.

The memory die 202 may comprise a die controller 214 that manages non-volatile memory 118 configured with SLC storage blocks 404 and MLC storage blocks 406. The die controller 214 of the memory die 202 may be coupled to the storage controller 120 through the data bus 130 and control bus that includes the DQS line 530 of the memory interface 128.

In one embodiment, the storage controller 120 may be configured to write test data 622 to an MLC storage block 406 in the non-volatile memory 118 via the data bus 130 at a data transfer speed. The storage controller 120 may be configured to read the test data 622 via the data bus 130 from the MLC storage block 406 at the data transfer speed. Next, the storage controller 120 may instruct the driver 612 to change the data transfer speed to one of the plurality of data transfer speeds.

Then, the storage controller 120 writes and reads the test data 622 via the data bus 130 from the MLC storage block 406 at one or more of the data transfer speeds. The storage controller 120 may read and write test data 622 iteratively for each of the plurality of data transfer speeds until each data transfer speed of the plurality of data transfer speeds 618 have been tested, and/or a bit error rate threshold is met or passed. For each of the data transfer speeds that the storage controller 120 tests, the storage controller 120 may determine a signal integrity for writing and reading of the test data 622.

Using these determined signal integrity measurements, the storage controller 120 may determine a multi-level storage cell data transfer speed 630 for MLC storage blocks 406 that has a desired signal integrity and a tolerable bit error rate. The storage controller 120 may determine the multi-level storage cell data transfer speed 630 such that the signal integrity satisfies a multi-level error correction threshold. In one embodiment, the multi-level storage cell data transfer speed 630 determined in this manner may serve as the default data transfer speed 228 discussed with regard to FIG. 2.

In one embodiment, the storage controller 120 may be configured to write test data 622 to an SLC storage block 404 in the non-volatile memory 118 via the data bus 130 at a data transfer speed. The storage controller 120 may be configured to read the test data 622 via the data bus 130 from the SLC storage block 404 at the data transfer speed. Next, the storage controller 120 may instruct the driver 612 to change the data transfer speed to one of the plurality of data transfer speeds.

Then, the storage controller 120 writes and reads the test data 622 via the data bus 130 from the SLC storage block 404 at one or more of the data transfer speeds. The storage controller 120 may read and write test data 622 iteratively for each of the plurality of data transfer speeds until each data transfer speed of the plurality of data transfer speeds 618 have been tested, and/or a bit error rate threshold is met or passed. For each of the data transfer speeds that the storage controller 120 tests, the storage controller 120 may determine a signal integrity for writing and reading of the test data 622.

Using these determined signal integrity measurements, the storage controller 120 may determine a single-level storage cell data transfer speed 626 for MLC storage blocks 406 that has a desired signal integrity and a tolerable bit error rate. The storage controller 120 may determine the single-level storage cell data transfer speed 626 such that the signal integrity satisfies a single-level error correction threshold.

In one embodiment, the read-write circuit 504 of the storage controller 120 may be configured to service storage operations for SLC storage block 404 using the single-level storage cell data transfer speed 626 and to service storage operations for MLC storage block 406 using the multi-level storage cell data transfer speed 630. The single-level storage cell data transfer speed 626 may correspond to a set of single level cell settings 608 loaded into interface settings 624 of the storage controller 120 when needed. The multi-level storage cell data transfer speed 630 may correspond to a set of multi-level cell settings 628 loaded into the control registers 610 when needed in turn.

Figure 7:
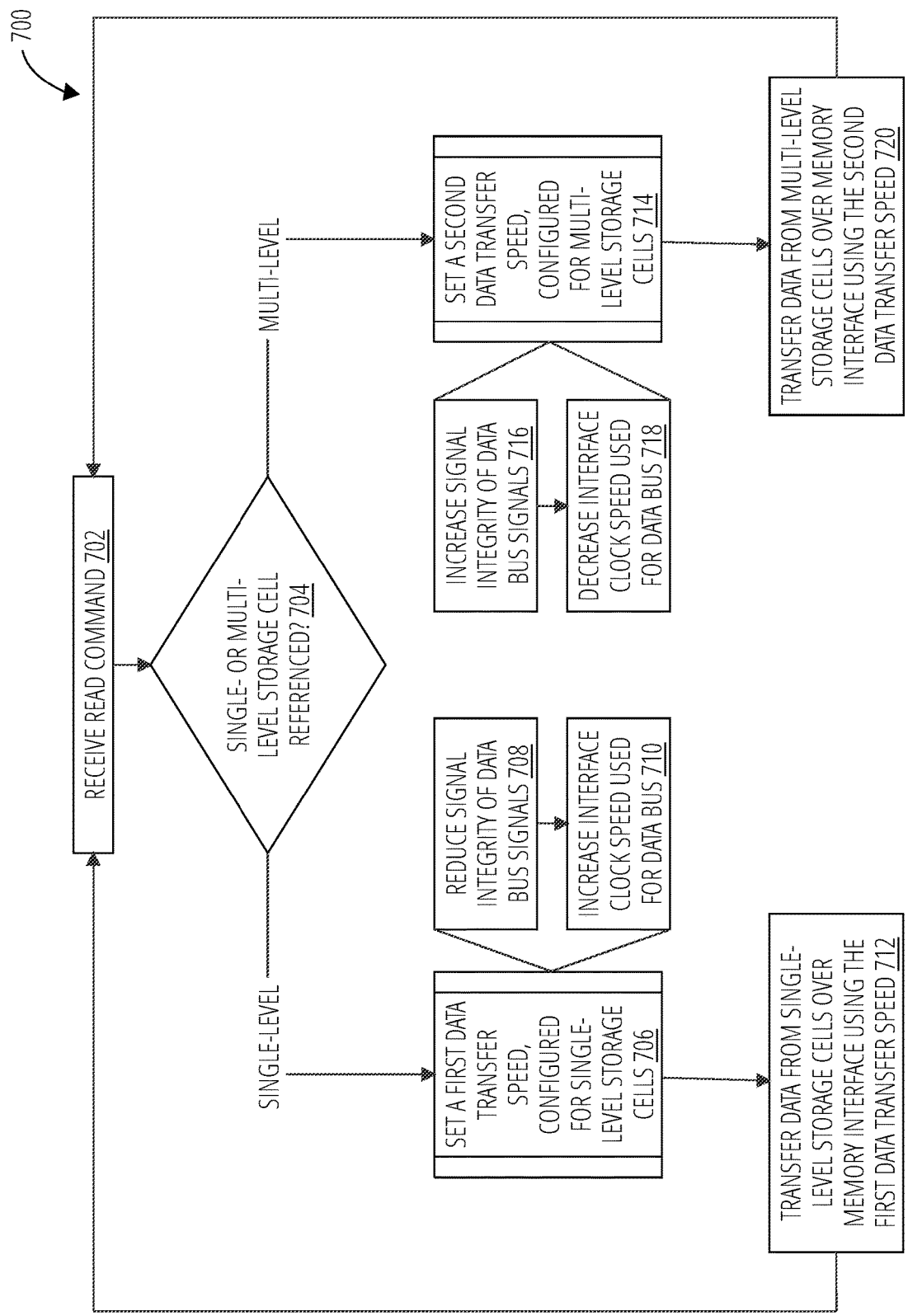
FIG. 7 is a flow diagram 700 of an exemplary method that may perform toggle mode write tuning.

FIG. 7 is a flow diagram 700 of an exemplary method that may change a memory die interface based on a type of storage cell, SLC storage cells vs. MLC storage cells, being accessed. In one embodiment, the method may change the interface settings based on which type of storage cells are being read from, or written to. A first read command may be received by the memory device at block 702. The memory device may determine at decision block 704 whether the first memory command references single-level storage cells or multi-level storage cells of a memory die.

If the first read command references single-level storage cells, the memory device may set a first data transfer speed such that this data transfer speed leverages the memory interface for data transfer from single-level storage cells. In one embodiment, setting this data transfer speed in subroutine block 706 may involve reducing the signal integrity of signals on the data bus in block 708 and increasing the interface clock speed used for the data bus in block 710.

Data may then be transferred from the single-level storage cell over the memory interface in block 712 using the first data transfer speed. In some embodiments, the memory device may automatically configure the memory interface for data transfer at a default data transfer speed once the data transfer for this first read command is complete. In other embodiments, the memory interface may remain configured for the first data transfer speed until a subsequent read command is received, as described below.

At block 702, the memory device may receive a second read command. The memory device may determine at decision block 704 that the second read command references multi-level storage cells of a memory die. In this case, the memory device may implement subroutine block 714, where a second data transfer speed may be set for the memory interface such that this second data transfer speed manages the memory interface for data transfer from multi-level storage cells. Setting this second data transfer speed in subroutine block 714 may involve increasing the signal integrity of signals on the data bus in block 716 and decreasing the interface clock speed used for the data bus in block 718. The memory device then transfers data from the second set of storage cells in block 720 using the second data transfer speed for multi-level storage cell.

Note that while a "first" and "second" read command and data transfer speed are described with regard to this illustration, the descriptive words "first" and "second" are not intended to limit this disclosure to only two options. One of ordinary skill in the art will recognize that multi-level storage cells may include storage cells storing two, three, four, or in future even more bits of data. Each type of storage cell may have different signal integrity and clock speed requirements, such that a third, fourth, etc., data transfer speed may be used to configure the memory interface for data transfer to a set of storage cells having particular attributes. In addition, the physical architecture of a memory die may induce different data transfer speeds for different physical memory locations. It is intended that the circuit, system, and methods disclosed herein may incorporate a range of interface settings for communications between a storage controller and storage media.

Figure 8:
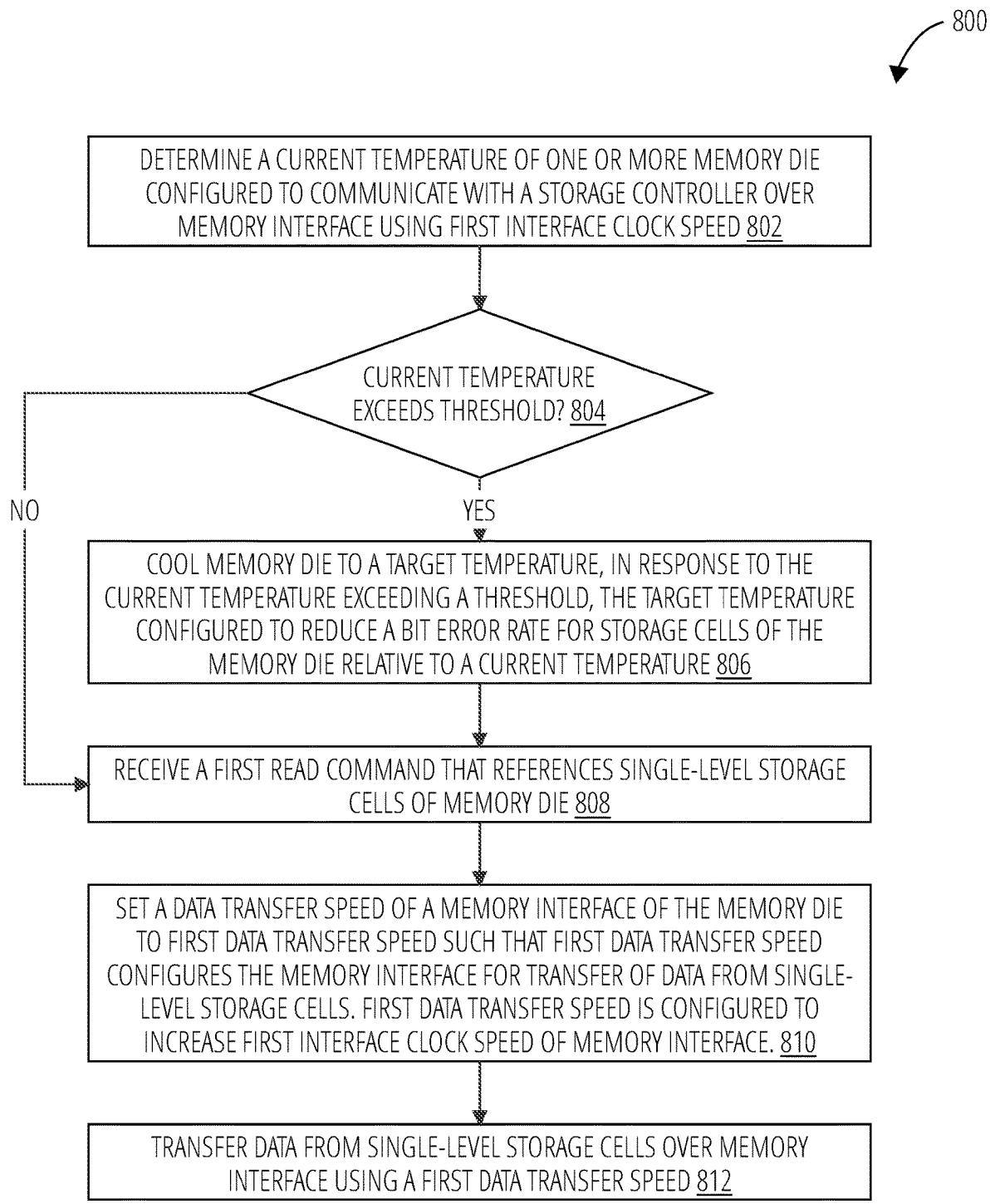
FIG. 8 is a flow diagram 800 of an exemplary method that may perform toggle mode write tuning.

As discussed previously, signal integrity is impacted by the interface clock speed used to transfer data across the memory interface. Signal integrity may be further reduced by increases in the physical temperature of the memory die and connected hardware. In addition, higher clocking speeds may induce a temperature increase in clock driven memory circuits, as additional energy is expended and dissipated as heat in support of faster signaling levels. FIG. 8 is a flow diagram 800 of an exemplary method that may, using the disclosed solutions, circuit and/or system, perform interface setting tuning in response to temperature fluctuations that may reduce signal integrity further at higher data transfer speeds, or may implement other die cooling methods as needed to support data transfer speeds.

The memory device may determine the current temperature of the memory die at block 802. The memory device may then determine, in decision block 804, whether or not the current temperature exceeds a predetermined temperature threshold. Temperature changes may impact MLC storage cells such that they experience a higher bit error rate than a single-level storage cell at the same temperature. In certain embodiments, if the temperature is too high the bit error rate for the MLC storage cells may rise to unacceptable levels. The threshold referenced in decision block 804 may be one of a set of thresholds selected depending on the storage cells referenced by the read command of block 808.

When the current temperature does not exceed the threshold at decision block 804, the memory device may take no action, and may move to block 808 upon receipt of a subsequent read command. However, in response to the current temperature exceeding the temperature threshold, the memory die may proceed to block 806.

At block 806, the memory device may take action to cool the memory die to a target temperature. This target temperature may be configured to reduce a bit error rate for storage cells of the memory die relative to the current temperature. Some memory devices may implement cooling methods such as, for example, by activating fans or liquid coolant flow, which may be adjusted to facilitate heat transfer from a memory die or device to the atmosphere or a heat sink. In some embodiments, clocking rates may be throttled in order to allow a die or memory device to cool. Any of a number of methods may be employed, individually or in combination, as will be understood by one skilled in the art. Once the memory die or memory device has a temperature that satisfies the target temperature, the method may proceed to block 808.

A first read command may be received at block 808, referencing single-level storage cells. As a result, at block 810, the method may adjust the memory interface of the memory die for a first data transfer speed, configured for transfer of data from single-level storage cells. This first data transfer speed may be configured to increase a first interface clock speed of the memory interface. At block 812, the memory device may next transfer the data from the referenced single-level storage cell over the memory interface using the first interface clock speed.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming. "Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A circuit, comprising:
    an initialization circuit configured to load multi-level cell settings to configure a memory interface for transfer of data for storage cells configured to store more than one bit per storage cell;
    a control circuit configured to receive a first read command that references storage cells of a memory die, the storage cells storing a single bit per storage cell;
    a switch circuit configured to switch settings for the memory interface from the multi-level cell settings to single level cell settings, in response to receiving the first read command; and
    a read-write circuit configured to read data for the first read command from the memory die using the single level cell settings.

2. The circuit of claim 1, wherein the switch circuit is configured to switch settings for the memory interface from the single level cell settings to the multi-level cell settings, in response to the read-write circuit reading data for the first read command.

3. The circuit of claim 1, wherein the control circuit is further configured to receive a second read command that references storage cells storing more than one bit per storage cell; and
    wherein the switch circuit is configured to switch settings for the memory interface from the single level cell settings to the multi-level cell settings in response to receiving the second read command.

4. The circuit of claim 3, wherein the control circuit receives the second read command subsequent to the first read command.

5. The circuit of claim 1, further comprising an error correction circuit configured to correct one or more errors in data read by the read-write circuit for the first read command.

6. The circuit of claim 5, wherein the single level cell settings are configured to reduce a signal integrity for the data read by the read-write circuit for the first read command and increase a data transfer speed and the error correction circuit is configured to perform error correction configured to compensate for the reduced signal integrity.

7. The circuit of claim 1, further comprising a tuner configured to tune a memory interface for transfer of data for storage cells configured to store more than one bit per storage cell and configured to generate the multi-level cell settings.

8. The circuit of claim 7, wherein the tuner is configured to tune the memory interface for transfer of data for storage cells configured to store a single bit per storage cell and configured to generate the single level cell settings.

9. The circuit of claim 1, wherein the single level cell settings are configured to increase a data transfer speed of the memory interface above the data transfer speed associated with the multi-level cell settings.

10. The circuit of claim 1, wherein the memory interface is configured to transfer the data using a double data rate protocol with the single level cell settings and with the multi-level cell settings.

11. A method, comprising:
receiving a first read command that references a set of single-level storage cells of a memory die;
setting a data transfer speed of a memory interface of the memory die to a first data transfer speed such that the first data transfer speed leverages the memory interface for transfer of data from the set of single-level storage cells; and
transferring data from the set of single-level storage cells over the memory interface using the first data transfer speed.

12. The method of claim 11, further comprising:
receiving a second read command that references a set of multi-level storage cell of a memory die;
setting the data transfer speed of the memory interface to a second data transfer speed such that the second data transfer speed leverages the memory interface for transfer of data from the set of multi-level storage cells; and
transferring data from the set of multi-level storage cells over the memory interface using the second data transfer speed.

13. The method of claim 12, wherein the second data transfer speed leverages the memory interface by increasing a signal integrity of signals of a data bus of the memory interface and by decreasing an interface clock speed used for the data bus.

14. The method of claim 11, wherein the first data transfer speed leverages the memory interface by reducing a signal integrity of signals of a data bus of the memory interface and by increasing an interface clock speed used for the data bus.

15. The method of claim 11, further comprising:
determining a current temperature of the memory die configured to communicate with a storage controller over the memory interface using a first interface clock speed;
cooling the memory die to a target temperature, in response to the current temperature exceeding a threshold, the target temperature configured to reduce a bit error rate for storage cells of the memory die relative to the current temperature;
wherein the first data transfer speed is configured to increase the first interface clock speed of the memory interface.

16. The method of claim 11, wherein setting the data transfer speed of the memory interface comprises loading control registers with interface settings configured to increase an interface clock speed of the memory interface.

17. The method of claim 11, wherein the memory interface comprises a data bus and a control bus.

18. The method of claim 11, wherein the memory interface is configured to transfer the data using a double data rate protocol.

19. A system, comprising:
a storage controller comprising:
a driver coupled to a data bus and a strobe line of a memory interface, the driver operable to adjust a data transfer speed of the data bus and the strobe line, the driver characterized by a plurality of data transfer speeds wherein each of the plurality of data transfer speeds presents a different signal integrity;
a clocking circuit operable to reduce the data transfer speed by delaying transmission of a strobe signal communicated by the strobe line, the clocking circuit characterized by a set of interface clock speeds; and
a signal integrity circuit configured to determine a signal integrity for the memory interface for a particular data transfer speed; and
a die controller of a memory die, the die controller coupled to the storage controller via the data bus and the strobe line;
wherein the storage controller is configured to:
write test data via the data bus, to a set of multi-level storage cells in the memory die at a data transfer speed;
read the test data via the data bus from the multi-level storage cells at the data transfer speed;
instruct the driver to change the data transfer speed to one of the plurality of data transfer speeds;
at each data transfer speed, write and read the test data via the data bus from the multi-level storage cells at the data transfer speed;
for each of the plurality of data transfer speeds, determine the signal integrity for writing and reading the test data; and
determine a multi-level storage cell data transfer speed for storage operations involving the multi-level storage cells such that the signal integrity satisfies a multi-level error correction threshold;
wherein the storage controller is further configured to:
write test data via the data bus, to a set of single-level storage cells in the memory die at a data transfer speed;
read the test data via the data bus from the single-level storage cells at the data transfer speed;
instruct the driver to change the data transfer speed to one of the plurality of data transfer speeds;
at each data transfer speed, write and read the test data via the data bus from the single-level storage cells at the data transfer speed;
for each of the plurality of data transfer speeds, determine the signal integrity for writing and reading the test data; and
determine a single-level storage cell data transfer speed for the storage operations involving the single-level storage cells such that the signal integrity satisfies a single-level error correction threshold; and
wherein the storage controller comprises a read-write circuit configured to:
service the storage operations involving the single-level storage cells using the single-level storage cell data transfer speed and to service the storage operations involving the multi-level storage cells using the multi-level storage cell data transfer speed.

20. The system of claim 19, wherein the single-level storage cell data transfer speed corresponds to a set of single level cell settings loaded into control registers of the storage controller and the multi-level storage cell data transfer speed corresponds to a set of multi-level cell settings loaded into the control registers.

* * * * *